(12) United States Patent
Won et al.

(10) Patent No.: US 7,316,961 B2
(45) Date of Patent: Jan. 8, 2008

(54) METHOD OF MANUFACTURING SEMICONDUCTOR DEVICE

(75) Inventors: Seok-jun Won, Seoul (KR); Weon-hong Kim, Suwon-si (KR); Yong-kuk Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 11/273,504

(22) Filed: Nov. 14, 2005

(65) Prior Publication Data

US 2006/0105521 A1    May 18, 2006

(30) Foreign Application Priority Data

Nov. 16, 2004   (KR)  .................... 10-2004-0093611
May 20, 2005    (KR)  .................... 10-2005-0042631

(51) Int. Cl.
*H01L 21/20* (2006.01)

(52) U.S. Cl. ............ 438/381; 438/704; 257/E21.22; 257/E21.646

(58) Field of Classification Search ............ 438/381, 438/704; 257/E21.22, E21.646
See application file for complete search history.

(56) References Cited

U.S. PATENT DOCUMENTS

2002/0127866 A1*  9/2002  Kwean et al. ............ 438/694
2005/0287738 A1* 12/2005  Cho et al. ................ 438/253
2007/0020944 A1*  1/2007  Chae et al. .............. 438/725

* cited by examiner

*Primary Examiner*—W. David Coleman
(74) *Attorney, Agent, or Firm*—Mills & Onello LLP

(57) ABSTRACT

Provided is a method of manufacturing a semiconductor device with enhancements of electrical characteristics. The method includes sequentially forming a lower electrode and an insulating layer on a semiconductor substrate, dry-etching a region of the insulating layer corresponding to a capacitor forming region so that the lower electrode is not exposed, forming an inter-insulating layer by wet-etching the insulating layer so that a region of the lower electrode corresponding to the capacitor forming region is exposed, and sequentially forming a dielectric layer and an upper electrode on the capacitor forming region to fabricate a capacitor.

28 Claims, 7 Drawing Sheets

METHOD OF MANUFACTURING SEMICONDUCTOR DEVICE

This application claims priority from Korean Patent Application Nos. 10-2004-0093611 and 10-2005-0042631 filed on Nov. 16, 2004 and May 20, 2005, respectively, in the Korean Intellectual Property Office, the contents of which are incorporated herein in their entirety by reference.

BACKGROUND OF THE INVENTION

1. Field of the Invention

The present invention relates to a method of manufacturing a semiconductor device, and more particularly, to a method of manufacturing a semiconductor device with enhanced electrical characteristics.

2. Description of the Related Art

The continuing dimensional shrinkage of semiconductor devices has resulted in increased electrical failures of capacitors, making it difficult to properly operate the semiconductor devices. In particular, in order to form a capacitor, it is necessary to dry-etch a predetermined region of an inter-insulating layer or a conductive layer. In such a case, however, a layer underlying a target layer to be etched may be susceptible to damage, unavoidably degrading electrical characteristics of the capacitor.

For example, in manufacturing a concave type capacitor, a lower electrode and an insulating layer are sequentially formed on a semiconductor substrate, and a predetermined region of the insulating layer is dry-etched to form a capacitor forming region. Then, a dielectric layer and an upper electrode are sequentially formed on the capacitor forming region to fabricate a capacitor. However, the lower electrode disposed below the insulating layer may be over-etched or damaged by $O_2$ plasma during etching.

Also, a planar type capacitor is formed by sequentially forming a lower electrode, a dielectric layer, and a conductive layer on a semiconductor substrate, followed by dry-etching of the conductive layer to form an upper electrode. If the underlying dielectric layer of the upper electrode is entirely etched, a lower electrode material is resputtered. Then, the resputtered flux is attached to a sidewall of the dielectric layer, resulting in leakage current. On the other hand, if the dielectric layer is partially etched, breakdown voltage characteristics vary according to the area of an unetched region. One attempt to solve this problem is to leave the dielectric layer as much as possible even after performing etching, which is achieved by increasing an etching selectivity between the conductive layer and the dielectric layer. In this case, however, an etch rate may be undesirably lowered.

SUMMARY OF THE INVENTION

The present invention provides a method of manufacturing a semiconductor device with enhanced electrical characteristics.

According to an aspect of the present invention, there is provided a method of manufacturing a semiconductor device, the method including sequentially forming a lower electrode and an insulating layer on a semiconductor substrate; dry-etching a region of the insulating layer corresponding to a capacitor forming region without exposing the lower electrode; forming an inter-insulating layer by wet-etching the insulating layer so that a region of the lower electrode corresponding to the capacitor forming region is exposed; and sequentially forming a dielectric layer and an upper electrode on the capacitor forming region to fabricate a capacitor.

In one embodiment, the insulating layer has a higher wet-etch rate than the lower electrode. The insulating layer can include FOX (Flowable OXide), TOSZ (Tonen SilaZene), USG (Undoped Silica Glass), BSG (Borosilica Glass), PSG (PhosphoSilica Glass), BPSG (BoroPhosphoSilica Glass), PE-TEOS (Plasma Enhanced-Tetra Ethyl Ortho Silicate), FSG (Fluoride Silicate Glass), HDP (high density plasma), or a combination thereof. The lower electrode can include one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof. The wet-etching can be performed using an etching solution selected from the group consisting of HF and a combined solution of HF, $H_2O_2$, and deionized water.

In one embodiment, an unetched region of the insulating layer corresponding to the capacitor forming region after the dry-etching has a thickness of 1,000 Å or less.

In one embodiment, in the step of sequentially forming the lower electrode and the insulating layer on the semiconductor substrate, the thickness of the insulating layer is substantially the same as or greater than the sum of the thickness of the inter-insulating layer of the capacitor fabricated according to the process of the invention and the thickness of a region of the insulating layer removed by the wet-etching.

In one embodiment, the insulating layer is a stacked structure composed of a first insulating layer and a second insulating layer. Dry-etching a region of the insulating layer corresponding to a capacitor forming region can include dry-etching a region of the second insulating layer corresponding to the capacitor forming region. Forming an inter-insulating layer by wet-etching the dry-etched insulating layer can include wet-etching a region of the first insulating layer corresponding to the capacitor forming region. In one embodiment, the second insulating layer has a higher dry-etch rate than the first insulating layer. In one embodiment, the first insulating layer is made of HDP (High Density Plasma), and the second insulating layer is made of PE-TEOS (Plasma Enhanced-Tetra Ethyl Ortho Silicate). In one embodiment, the first insulating layer has a thickness of 1,000 Å or less.

According to another aspect of the present invention, there is provided a method of manufacturing a semiconductor device, the method including: sequentially forming a lower electrode, a dielectric layer, and a conductive layer on a semiconductor substrate; dry-etching a region of the conductive layer except a capacitor forming region without exposing the dielectric layer; and wet-etching the conductive layer to form an upper electrode exposing the dielectric layer to fabricate a capacitor.

In one embodiment, the conductive layer has a higher wet-etch rate than the dielectric layer. The conductive layer can include one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof. The conductive layer can be one of a mono-layered structure and a multi-layered structure composed of one of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and a combination thereof.

In one embodiment, the wet-etching is performed using an etching, solution selected from the group consisting of HF, $H_2SO_4$, and SCl.

In one embodiment, the method further comprises performing one of plasma treatment and ion implantation of the conductive layer prior to the wet-etching. In one embodiment, the plasma treatment is performed using $O_2$-containing plasma. The ion implantation an be performed using one of He, Ne, Ar, Si, Ge, F, Cl, Br, In, and a combination thereof. The conductive layer can have a higher wet-etch rate than the dielectric layer. The conductive layer can include one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof. The conductive layer can be one of a mono-layered structure and a multi-layered structure composed of one of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRu_3$, $(Ba,Sr)TiO_3$, $Pb(Zr,Ti)O_3$, $(Pb,La)(Zr,Ti)O_3$, $(Sr,Ca)RuO_3$, and a combination thereof. The wet-etching can be performed using an etching solution selected from the group consisting of HF, $H_2SO_4$, and SCl.

In one embodiment, an unetched region of the conductive layer except the capacitor forming region after the dry-etching has a thickness of 1,000 Å or less.

In one embodiment, in the sequentially forming of the lower electrode, the dielectric layer, and the conductive layer on the semiconductor substrate, the thickness of the conductive layer is substantially the same as or greater than the sum of the thickness of the upper electrode of the capacitor and the thickness of a region of the conductive layer removed by wet-etching.

In one embodiment, the conductive layer is a stacked structure composed of a first conductive layer and a second conductive layer. Dry-etching a region of the conductive layer except a capacitor forming region comprises dry-etching a region of the second conductive layer except the capacitor forming region. Wet-etching the conductive layer dry-etched comprises wet-etching a region of the first conductive layer except the capacitor forming region. Dry-etching of the region of the second conductive layer except the capacitor forming region can be is performed using an end point detection method until the first conductive layer is exposed. The first conductive layer can have a thickness of 1,000 Å or less.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

FIGS. 1A through 1D are sectional views illustrating a method of manufacturing a semiconductor device according to a first embodiment of the present invention, in which a concave type capacitor is described by way of example.

Figure 1A:
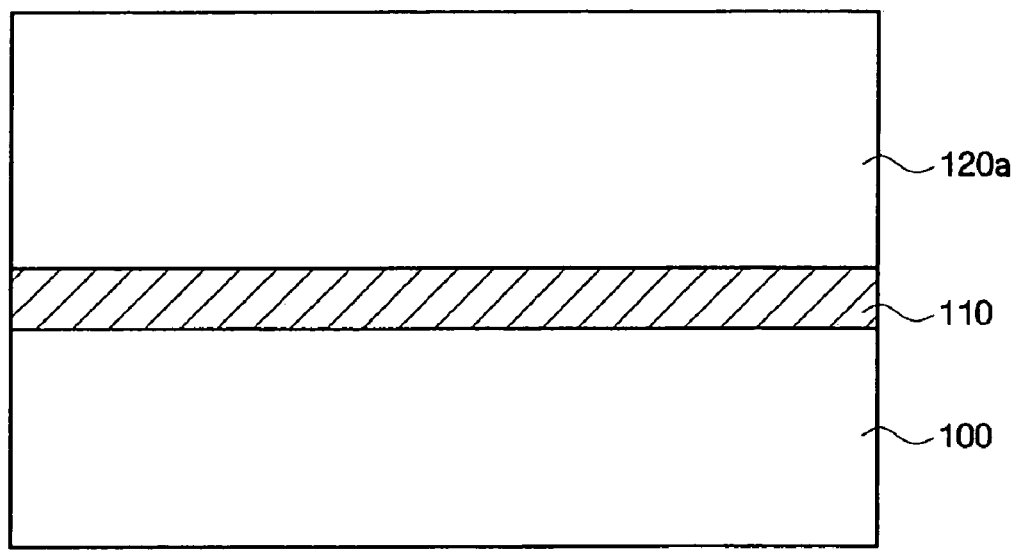
FIGS. 1A through 1D are sectional views illustrating a method of manufacturing a semiconductor device according to a first embodiment of the present invention.

Referring to FIG. 1A, a lower electrode 110 and an insulating layer 120a are first sequentially formed on a semiconductor substrate 100.

Examples of the semiconductor substrate 100 include a silicon substrate, a silicon on insulator (SIO) substrate, a gallium arsenic substrate, a silicon germanium substrate, a ceramic substrate, a quartz substrate, and a display glass substrate.

The lower electrode 110 is formed on the semiconductor substrate 100, and may be made of a material having a lower wet-etch rate than the insulating layer 120a. For example, the lower electrode 110 may be made of Ru, Rh, Os, Pd, Pt, W, Mo, Ti, Ta, Al, Cu, Hf, Zr, WN, MoN, TiN, TaN, AlN, HfN, ZrN, TaSiN, or a combination thereof. The lower electrode 110 may be formed to a thickness of about 300 to 1,500 Å by CVD (Chemical Vapor Deposition), PVD (Physical Vapor Deposition), or the like. Here, the CVD process may be ALD (Atomic Layer Deposition), PEALD (Plasma-Enhanced ALD), MOCVD (Metal-Organic CVD), PECVD (Plasma-Enhanced CVD), or the like.

The insulating layer 120a is formed on the lower electrode 110, and may be made of a material having a higher wet-etch rate than the lower electrode 110. For example, the insulating layer 120a may be made of FOX (Flowable OXide), TOSZ (Tonen SilaZene), USG (Undoped Silicate Glass), BSG (Boro Silicate Glass), PSG (Phospho Silicate Glass), BPSG (BoroPhospho Silicate Glass), PE-TEOS (Plasma Enhanced-Tetra Ethyl Ortho Silicate), FSG (Fluoride Silicate Glass), HDP (high density plasma), or the like.

The insulating layer 120a may be formed to a thickness of about 1,000 to 5,000 Å by LPCVD (Low-Pressure CVD) or PECVD. Here, the insulating layer 120a is partially removed by wet-etching as will be described below. In this regard, the thickness of the insulating layer 120a can be adjusted accordingly. The thickness of the insulating layer 120a may be substantially the same as the sum of the thickness of an inter-insulating layer of a capacitor fabricated by the process of the invention and the thickness of a region of the insulating layer 120a removed by wet-etching or may be the same as the sum of the thickness of the inter-insulating layer and the thickness of a region of the insulating layer 120a removed by over-etching.

Figure 1B:
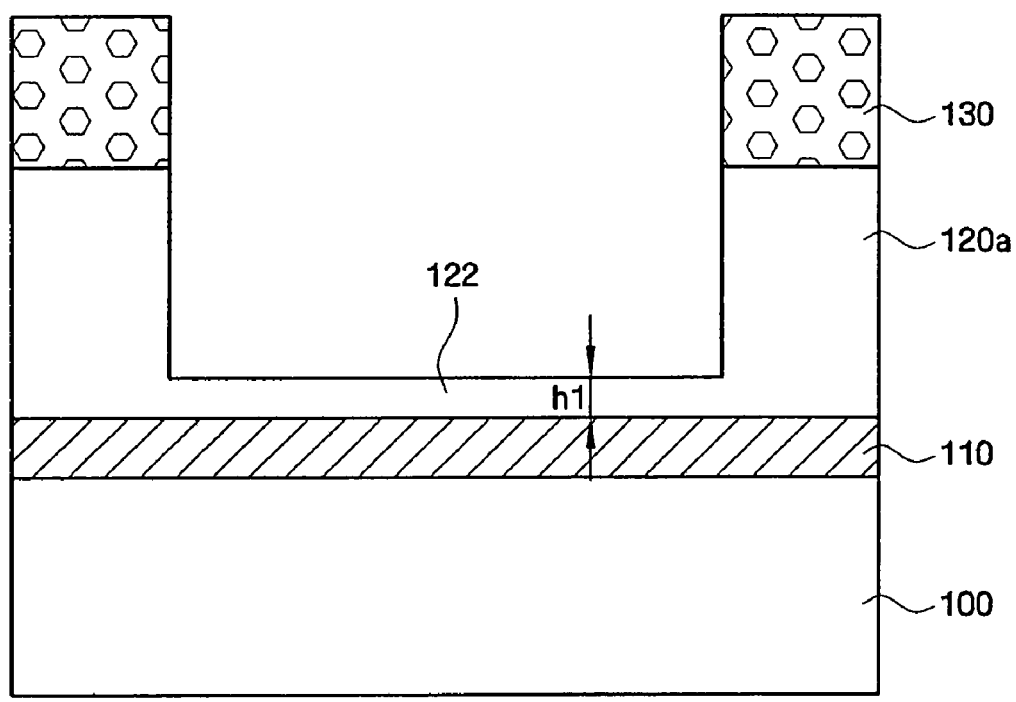

Referring to FIG. 1B, a mask pattern 130 is formed on the insulating layer 120a and the insulating layer 120a is dry-etched so that the lower electrode 110 is not exposed, that is, without exposing the lower electrode 110. A region of the insulating layer 120a corresponding to a capacitor forming region is dry-etched so that the lower electrode 110 is not exposed.

The mask pattern 130 is used as an etching mask for patterning the insulating layer 120a, and may be formed to a thickness of 500 to 2,000 Å using $SiO_2$, SiON, photoresist, etc.

A thickness h1 of an unetched region 122 of the insulating layer 120a may be 1,000 Å or less, but the present invention is not limited thereto. That is, the thickness h1 of the unetched region 122 may be changed according to the shape of the capacitor forming region, the material of the insulating layer 120a, an etching gas used for dry-etching, etc. For example, the insulating layer 120a may be formed to a thickness of 2,000 Å, followed by dry-etching, to leave the unetched region 122 with a thickness of about 400 Å.

The mask pattern 130 is removed from the insulating layer 120a. Even when the mask pattern 130 is removed, for example, by etching, the lower electrode 110 is not damaged by $O_2$ plasma due to the unetched region 122 remaininig on the lower electrode 110.

Figure 1C:
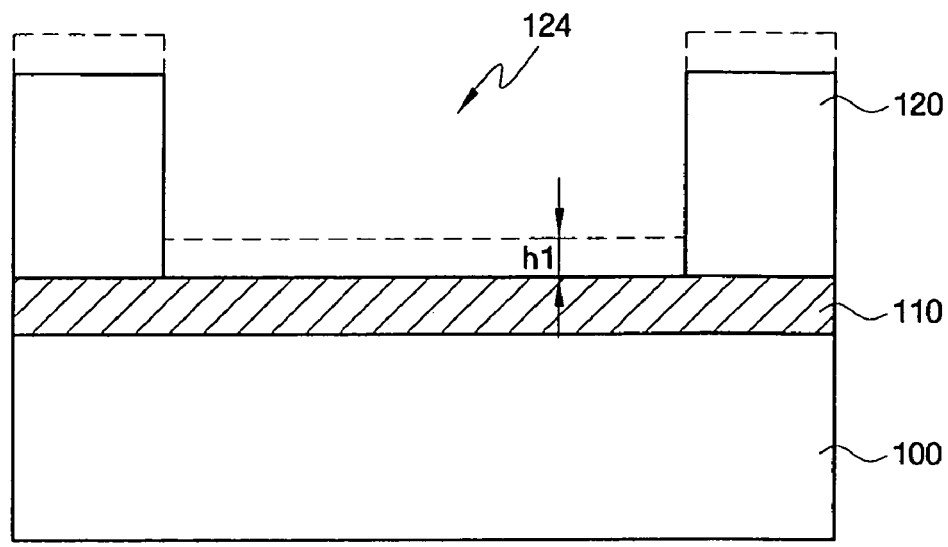

Referring to FIG. 1C, the unetched region 122 (see FIG. 1B) of the insulating layer 120a (see FIG. 1B) is wet-etched to fabricate an inter-insulating layer 120 defining a capacitor forming region 124 through which the lower electrode 110 is exposed.

Here, the wet-etching is performed using a hydrofluoric acid (HF) or a LAL solution as an etching solution. The LAL solution refers to an etching solution composed of a combination of HF, $H_2O_2$, deionized water, etc.

In particular, in this embodiment, the insulating layer 120a can be selectively wet-etched since it exhibits a higher wet-etch rate in an etching solution relative to the lower electrode 110. Therefore, damage to the lower electrode 110 by over-etching, etc. can be reduced. Here, the degree of the wet-etching can be adjusted by adjusting an etching time. If over-etching time for uniform removal of regions to be etched on the semiconductor substrate 100 is minimized, damage to the lower electrode 110 can be additionally reduced.

In particular, in this embodiment, while the unetched region 122 of the insulating layer 120a corresponding to the capacitor forming region 124 is completely wet-etched, a region of the insulating layer 120a disposed outside the capacitor forming region 124 can be wet-etched by a predetermined thickness. As described above, the thickness of the insulating layer 120a is substantially the same as the sum of the thickness of the inter-insulating layer 120 of a capacitor fabricated in accordance with the process of the invention and the thickness of a region of the insulating layer 120a removed by wet-etching or is the same as the sum of the thickness of the inter-insulating layer 120 and the thickness of a region of the insulating layer 120a removed by over-etching. Thus, even when the insulating layer 120a is wet-etched, the inter-insulating layer 120 of a capacitor fabricated according to the invention can be maintained at a predetermined thickness.

Figure 1D:
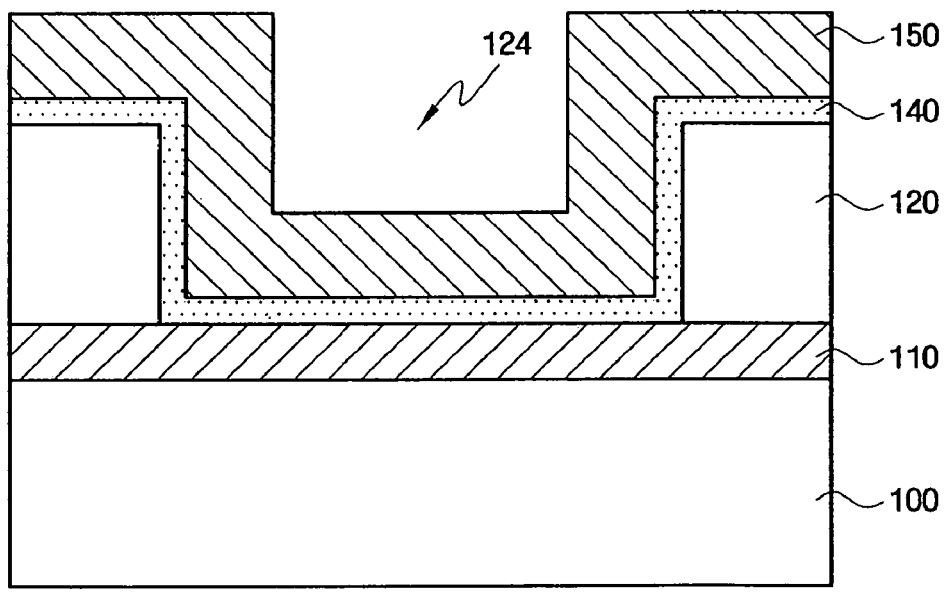

Referring to FIG. 1D, a dielectric layer 140 and an upper electrode 150 are sequentially formed on the capacitor forming region 124 to fabricate a capacitor.

Even when the capacitor shrinks, the dielectric layer 140 is preferably a high dielectric layer having a high dielectric constant (high-k) to achieve a desired capacitance. The high dielectric characteristics of the high dielectric layer 140 result from strong ionic polarization. The high dielectric layer 140 may be formed of a mono-layered or multi-layered structure (e.g., laminate structure) made of $HfO_2$, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, (Ba, Sr)$TiO_3$, Pb(Zr,Ti)$O_3$, (Pb,La)(Zr,Ti)$O_3$, (Sr,Ca)$RuO_3$, or a combination thereof.

The dielectric layer 140 may be formed to a thickness of 10 to 100 Å by CVD. The CVD process may be ALD or MOCVD.

The upper electrode 150 may be formed to a thickness of 300 to 1,500 Å by CVD, PVD, or the like. The upper electrode 150 may be made of Ru, Rh, Os, Pd, Pt, W, Mo, Ti, Ta, Al, Cu, Hf, Zr, WN, MoN, TiN, TaN, AlN, HfN, ZrN, TaSiN, or a combination thereof.

FIGS. 2A through 2D are sectional views illustrating a method of manufacturing a semiconductor device according to a second embodiment of the present invention. Substantially the same elements as shown in FIGS. 1A through 1D are represented by the same reference numerals, and thus, a detailed description thereof will not be repeated.

Figure 2A:
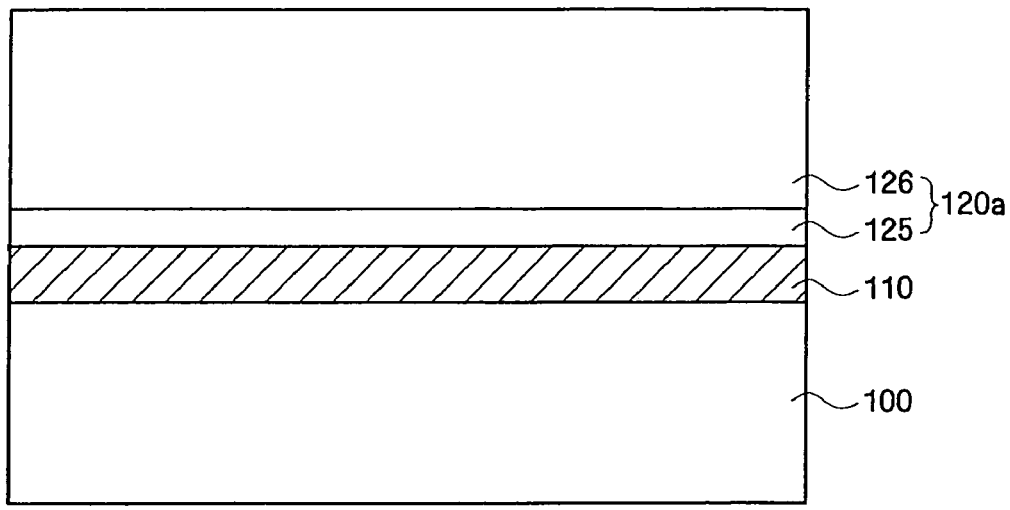
FIGS. 2A through 2D are sectional views illustrating a method of manufacturing a semiconductor device according to a second embodiment of the present invention.

Referring to FIG. 2A, a lower electrode 110 and an insulating layer 120a are sequentially formed on a semiconductor substrate 100. The insulating layer 120a is a stacked structure composed of a first insulating layer 125 and a second insulating layer 126. The second insulating layer 126 is made of a material having a higher dry-etch rate than the first insulating layer 125. For example, the first insulating layer 125 may be made of HDP and the second insulating layer 126 may be made of PE-TEOS. The second insulating layer 126 may be thicker than the first insulating layer 125, but the present invention is not limited thereto. The first insulating layer 125 may be formed to a thickness of 1,000 Å, but the present invention is not limited thereto.

Figure 2B:
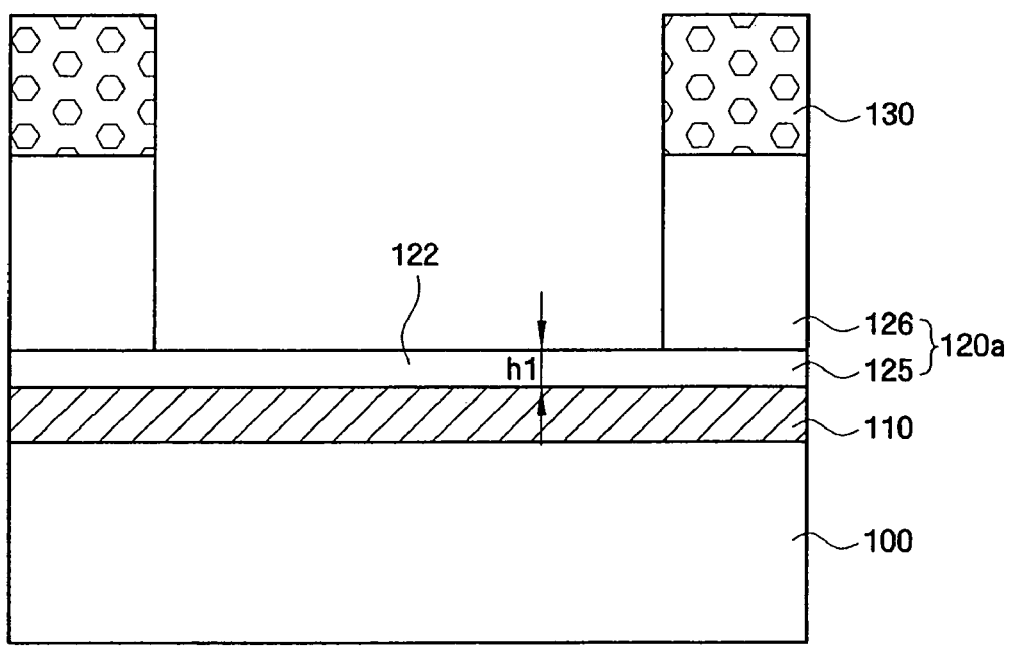

Referring to FIG. 2B, a mask pattern 130 is formed on the second insulating layer 126, and the second insulating layer 126 is then dry-etched. Here, the second insulating layer 126 can be selectively etched since it has a higher dry-etch rate than the first insulating layer 125. Thus, a thickness hi of an unetched region 122 of the insulating layer 120a may be substantially the same as that of the first insulating layer 125.

As described above, when the first and second insulating layers 125 and 126 are used, accuracy of the thickness hi of the unetched region 122 of the insulating layer 120a can be ensured.

Figure 2C:
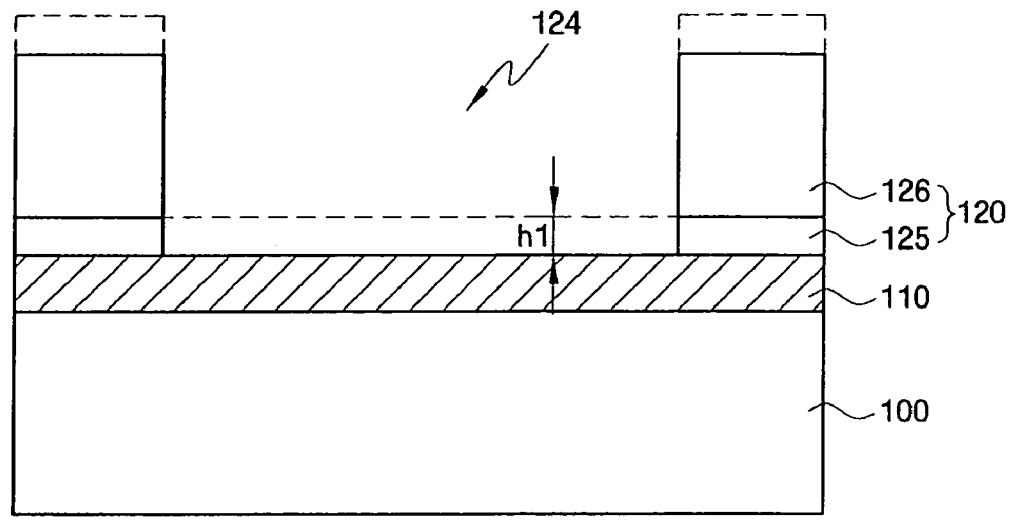

Referring to FIG. 2C, the unetched region 122 of the insulating layer 120a, i.e., a region of the first insulating layer 125, is wet-etched to form an inter-insulating layer 120 defining a capacitor forming region 124 through which the lower electrode 110 is exposed. While the region of the first insulating layer 125 corresponding to the capacitor forming region 124 is completely wet-etched, the second insulating layer 126 disposed outside the capacitor forming region 124 is wet-etched by a predetermined thickness.

Figure 2D:
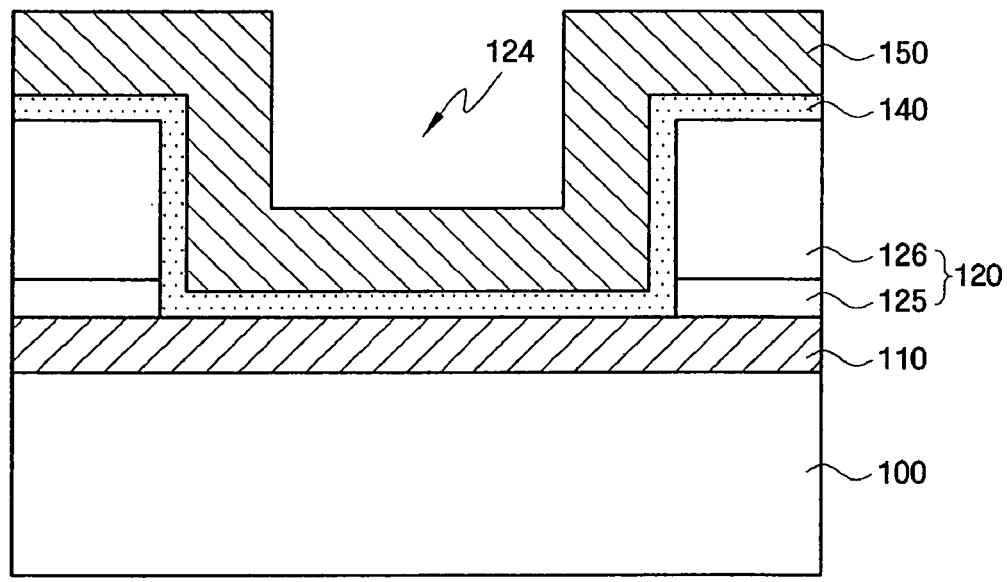

Referring to FIG. 2D, a dielectric layer 140 and an upper electrode 150 are sequentially formed on the capacitor forming region 124 to fabricate a capacitor.

Figure 3A:
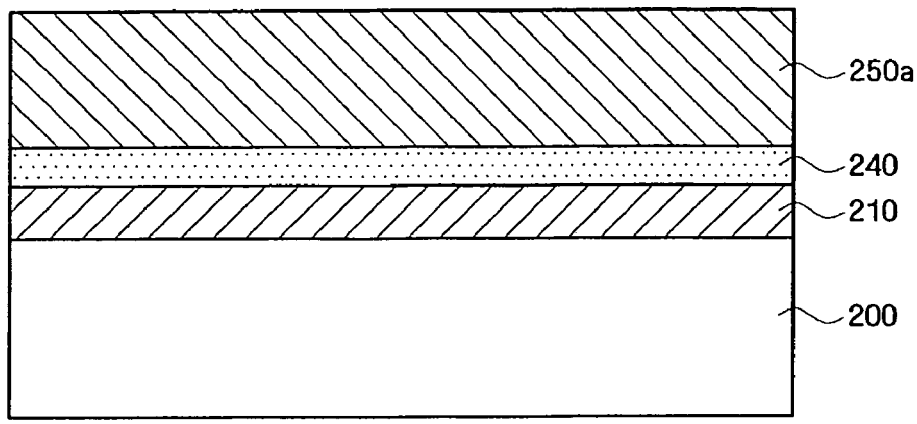
FIGS. 3A through 3C are sectional views illustrating a method of manufacturing a semiconductor device according to a third embodiment of the present invention.
Figure 3B:
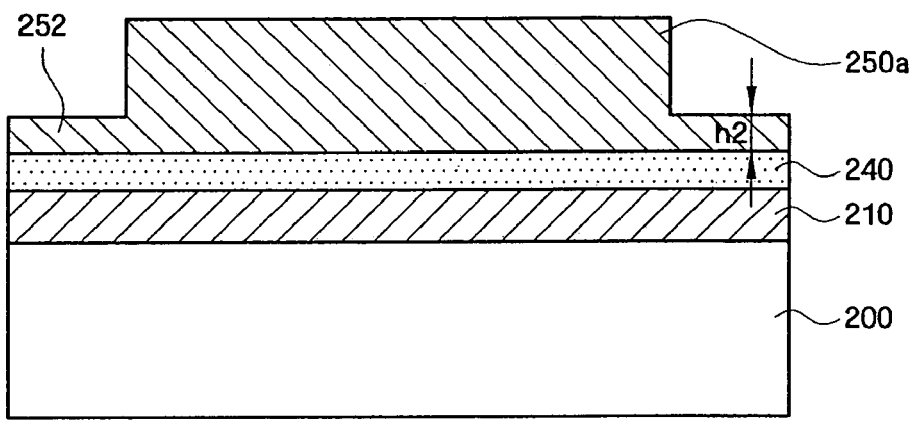
Figure 3C:
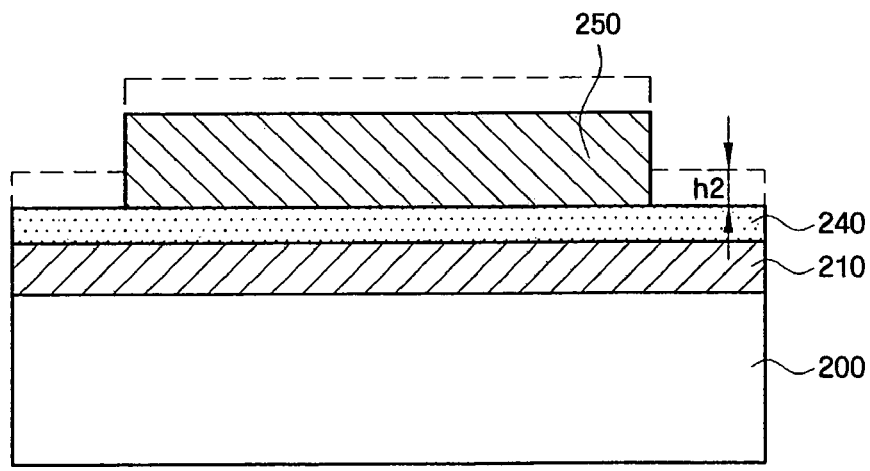

FIGS. 3A through 3C are sectional views illustrating a method of manufacturing a semiconductor device according to a third embodiment of the present invention. The semiconductor device according to the third embodiment of the present invention is exemplified by a planar type capacitor.

Referring to FIG. 3A, a lower electrode 210, a dielectric layer 240, and a conductive layer 250a are sequentially formed on a semiconductor substrate 200.

The semiconductor substrate 200 may be a silicon substrate, a SOI (Silicon On Insulator) substrate, a gallium arsenic substrate, a silicon germanium substrate, a ceramic substrate, a quartz substrate, a glass substrate for display, etc.

The lower electrode 210 is formed on the semiconductor substrate 200, and may be made of Ru, Rh, Os, Pd, Pt, W, Mo, Ti, Ta, Al, Cu, Hf, Zr, WN, MoN, TiN, TaN, AlN, HfN, ZrN, TaSiN, or a combination thereof.

The lower electrode 210 may be formed to a thickness of about 300 to 1,500 Å by CVD, PVD, etc. Here, the CVD process may be ALD, PEALD, MOCVD, PECVD, or the like.

The dielectric layer 240 is formed on the lower electrode 210, and may be made of a material having a lower wet-etch rate than the conductive layer 250a.

Even when the capacitor shrinks, the dielectric layer 240 is preferably a high dielectric layer having a high-k value to accomplish a desired capacitance. The high dielectric characteristics of the high dielectric layer result from strong ionic polarization. The dielectric layer 240 may be a mono-layered or multi-layered structure (e.g., laminate structure) made of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, or a combination thereof.

The dielectric layer 240 may be formed to a thickness of 10 to 100 Å by CVD. The CVD process may be ALD or MOCVD.

The conductive layer 250a is formed on the dielectric layer 240, and may be made of a material having a higher wet-etch rate than the dielectric layer 240. The conductive layer 250a may be formed to a thickness of 300 to 1,500 Å by CVD, PVD, etc. Here, the conductive layer 250a may be made of Ru, Rh, Os, Pd, Pt, W, Mo, Ti, Ta, Al, Cu, Hf, Zr, WN, MoN, TiN, TaN, AlN, HfN, ZrN, TaSiN, or a combination thereof.

The conductive layer 250a is partially removed by wet-etching as will be described below. In this regard, the thickness of the conductive layer 250a can be adjusted accordingly. In detail, the conductive layer 250a may be substantially the same as the sum of the thickness of an upper electrode of a capacitor fabricated according to the process of the invention and the thickness of a region of the conductive layer 250a removed by wet-etching or may be the same as the sum of the thickness of the upper electrode and the thickness of a region of the conductive layer 250a removed by over-etching.

Referring to FIG. 3B, a mask pattern (not shown) is formed on the conductive layer 250a, and the conductive layer 250a is dry-etched so that the dielectric layer 240 is not exposed. In detail, a region of the conductive layer 250a except a capacitor forming region is dry-etched so that the dielectric layer 240 is not exposed. Here, a thickness h2 of an unetched region 252 of the conductive layer 250a may be 1,000 Å, but the present invention is not limited thereto. That is, the thickness h2 of the unetched region 252 of the conductive layer 250a can be changed according to the shape of an upper electrode, the material of the conductive layer 250a, an etching gas used for dry-etching, etc.

Referring to FIG. 3C, the unetched region 252 (see FIG. 3B) of the conductive layer 250a (see FIG. 3B) is wet-etched to form an upper electrode 250 exposing the dielectric layer 240, to thus fabricate a capacitor. The wet-etching may be performed using an etching solution such as HF, $H_2SO_4$, or SC1 (Standard Clean 1). Here, the SC1 refers to an etching solution composed of $NH_4OH$, $H_2O_2$, and $H_2O$ in a combination ratio of about 1:1:5.

In this embodiment, since the conductive layer 250a exhibits a higher etch rate in the etching solution relative to the dielectric layer 240, the etching of the dielectric layer 240 hardly occurs. For example, when the conductive layer 250a is made of TiN and the dielectric layer 240 is a laminate structure composed of HfO/AlO, the wet-etch rate of TiN is 350 Å/min or more in a dilute HF solution ($HF/H_2O$, 1:200) and 20 Å/min or more in $H_2SO_4$ at about 145° C., whereas the wet-etch rate of the HfO/AlO is 12 Å/min or more in a dilute HF solution ($HF/H_2O$, 1:200) and 15 to 20 Å/min or more in $H_2SO_4$ at about 145° C.

The dielectric layer 240 made of $Ta_2O_5$ is minimally etched in an etching solution such as HF, $H_2SO_4$, or SC1.

Thus, the dielectric layer 240 of the capacitor of this embodiment is minimally etched, and thus the underlying lower electrode 210 of the dielectric layer 240 is not damaged. Furthermore, since the dielectric layer 240 has a uniform thickness, uniform breakdown voltage characteristics are ensured.

The degree of the wet-etching according to this embodiment can be controlled by adjusting a wet-etching time. If over-etching time for uniform removal of regions to be etched on the semiconductor substrate 200 is minimized, damage to the dielectric layer 240 can be additionally reduced.

Since the conductive layer 250a is wet-etched after dry-etching, the thickness of the upper electrode 250 may be reduced. As described above, the thickness of the conductive layer 250a is substantially the same as the sum of the thickness of the upper electrode 250 of the capacitor fabricated according to the process of the invention and the thickness of a region of the conductive layer 250a removed by wet-etching or is the same as the sum of the thickness of the upper electrode 250 and the thickness of a region of the conductive layer 250a removed by over-etching. Thus, even when the conductive layer 250a is wet-etched, the upper electrode 250 of the capacitor fabricated according to the invention can be maintained at a predetermined thickness.

Figure 4:
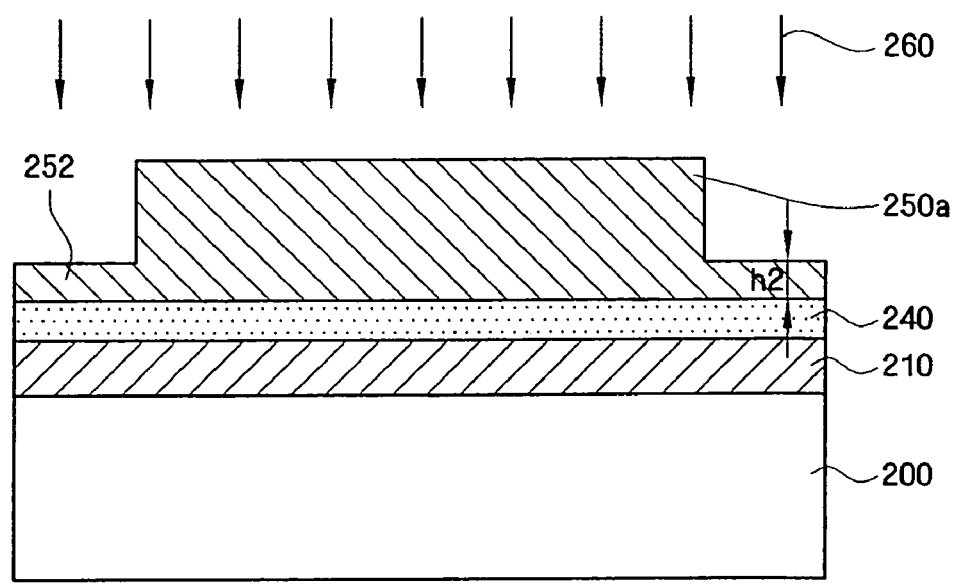
FIG. 4 is a sectional view illustrating a method of manufacturing a semiconductor device according to a fourth embodiment of the present invention.

FIG. 4 is a sectional view illustrating a method of manufacturing a semiconductor device according to a fourth embodiment of the present invention. The fourth embodiment of the present invention is the same as the third embodiment except that after the process shown in FIG. 3B, the process shown in FIG. 4 is further performed, and thus a detailed description of overlapping parts of the processes will not be repeated.

Referring to FIG. 4, after dry-etching, the conductive layer 250a is subjected to amorphization treatment 260. Here, the amorphization treatment 260 refers to the phase transition of the conductive layer 250a to amorphous phase. The amorphization treatment 260 may be plasma treatment using $O_2$-containing plasma, e.g., $O_2$, $N_2O$, or $O_3$ plasma, or ion implantation using He, Ne, Ar, Si, Ge, F, Cl, Br or In.

Due to the amorphization treatment 260, the conductive layer 250a can be easily wet-etched since it has an amorphous structure with a relatively low interatomic binding force. Thus, the unetched region 252 of the conductive layer 250a can be removed without causing damage to the dielectric layer 240 and the lower electrode 210.

Figure 5A:
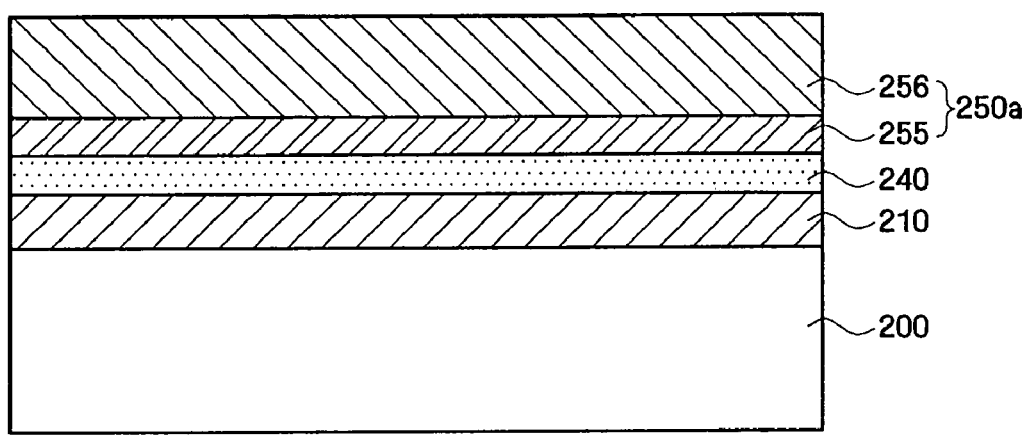
FIGS. 5A through 5C are sectional views illustrating a method of manufacturing a semiconductor device according to a fifth embodiment of the present invention.
Figure 5B:
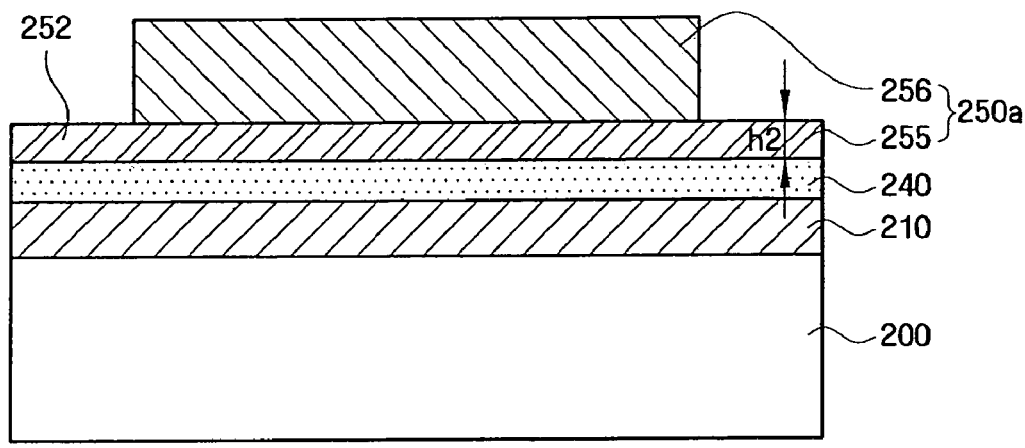
Figure 5C:
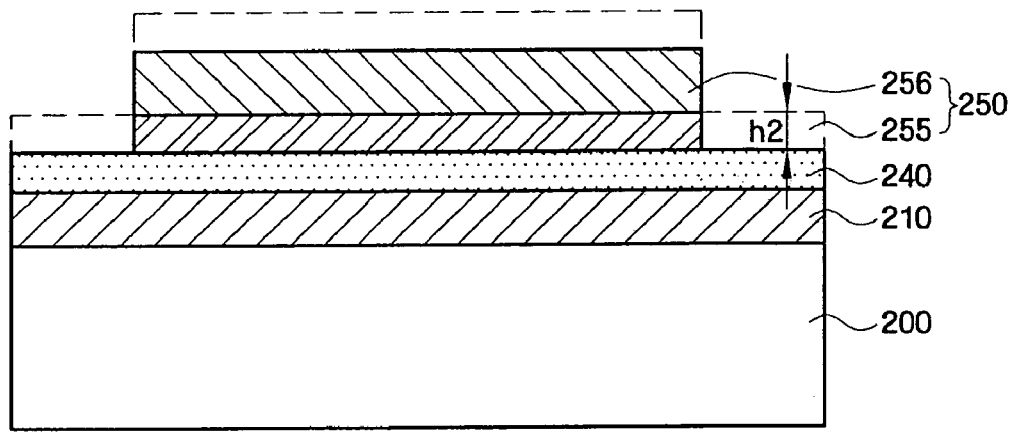

FIGS. 5A through 5C are sectional views illustrating a method of manufacturing a semiconductor device according to a fifth embodiment of the present invention. Substantially the same elements as shown in FIGS. 3A through 3C are represented by the same reference numerals, and thus, a detailed description thereof will not be repeated.

Referring to FIG. 5A, a lower electrode 210, a dielectric layer 240, and a conductive layer 250a are sequentially formed on a semiconductor substrate 200. The conductive layer 250a is a stacked structure composed of a first conductive layer 255 and a second conductive layer 256. For example, the first conductive layer 255 may be made of TiN and the second conductive layer 256 may be made of TaN. The second conductive layer 256 may be thicker than the first conductive layer 255, but the present invention is not limited thereto. The thickness of the first conductive layer 255 may be 1,000 Å, but the present invention is not limited thereto.

Referring to FIG. 5B, a mask pattern (not shown) is formed on the conductive layer 250a and the second conductive layer 256 is dry-etched. The dry-etching of the second conductive layer 256 can be selectively performed by an End Point Detection (EPD) method. Thus, the thickness h2 of an unetched region 252 of the conductive layer 250a may be substantially the same as the thickness of the first conductive layer 255.

As described above, when the first and second conductive layers 255 and 256 are used, accuracy of the thickness h2 of the unetched region 252 of the conductive layer 250a can be ensured.

Referring to FIG. 5C, the unetched region 252 (see FIG. 5B) of the conductive layer 250a (see FIG. 5B), i.e., a region of the first conductive layer 255, is wet-etched to form an upper electrode 250 exposing the dielectric layer 240, to thus fabricate a capacitor. However, since the conductive layer 250a is wet-etched after dry-etching, the thickness of the upper electrode 250 may be reduced.

In this embodiment, the wet-etch rate of the first conductive layer 255 is similar to that of the second conductive layer 256, but the present invention is not limited thereto. That is, if the wet-etch rate of the first conductive layer 255 is higher than that of the second conductive layer 256, an undercut structure may be formed. Even when the undercut structure is formed, an inter-insulating layer may be filled into the undercut structure in a subsequent process, forming a dielectric layer, resulting in a reduction of leakage current. On the other hand, when the wet-etch rate of the first conductive layer 255 is lower than that of the second conductive layer 256, a stepped structure may be formed. It is obvious to those of ordinary skill in the art that the stepped structure does not affect electrical properties of a capacitor.

A method of manufacturing a semiconductor device of the present invention provides at least the following advantages.

First, since dry etching and wet etching are continuously performed in the course of forming a capacitor, unnecessary damage to the underlying layer of a patterned layer can be prevented.

Second, the electrical characteristics of a capacitor, e.g., leakage current characteristics, breakdown voltage characteristics, etc. can be enhanced.

Third, prior to wet-etching, amorphization treatment is performed, thereby easily removing a conductive layer using wet-etching.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A method of manufacturing a semiconductor device, the method comprising:
    sequentially forming a lower electrode and an insulating layer on a semiconductor substrate;
    dry-etching a region of the insulating layer corresponding to a capacitor forming region without exposing the lower electrode;
    forming an inter-insulating layer by wet-etching the insulating layer so that a region of the lower electrode corresponding to the capacitor forming region is exposed; an
    sequentially forming a dielectric layer and an upper electrode on the capacitor forming region to fabricate a capacitor.

2. The method of claim 1, wherein the insulating layer has a higher wet-etch rate than the lower electrode.

3. The method of claim 1, wherein an unetched region of the insulating layer corresponding to the capacitor forming region after the dry-etching has a thickness of 1,000 Å or less.

4. The method of claim 1, wherein in the step of sequentially forming the lower electrode and the insulating layer on the semiconductor substrate, the thickness of the insulating layer is substantially the same as or greater than the sum of the thickness of the inter-insulating layer of the capacitor and the thickness of a region of the insulating layer removed by the wet-etching.

5. The method of claim 1, wherein:
    the insulating layer is a stacked structure composed of a first insulating layer and a second insulating layer;
    dry-etching a region of the insulating layer corresponding to a capacitor forming region comprises dry-etching a region of the second insulating layer corresponding to the capacitor forming region; and
    forming an inter-insulating layer by wet-etching the dry-etched insulating layer comprises wet-etching a region of the first insulating layer corresponding to the capacitor forming region.

6. The method of claim 2, wherein the insulating layer comprises FOX (Flowable OXide), TOSZ (Tonen SilaZene), USG (Undoped Silica Glass), BSG (Borosilica Glass), PSG (PhosphoSilica Glass), BPSG (BoroPhosphoSilica Glass), PE-TEOS (Plasma Enhanced-Tetra Ethyl Ortho Silicate), FSG (Fluoride Silicate Glass), HDP (high density plasma), or a combination thereof.

7. The method of claim 2, wherein the lower electrode comprises one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof.

8. The method of claim 2, wherein the wet-etching is performed using an etching solution selected from the group consisting of HF and a combined solution of HF, $H_2O_2$, and deionized water.

9. The method of claim 5, wherein the second insulating layer has a higher dry-etch rate than the first insulating layer.

10. The method of claim 5, wherein the first insulating layer has a thickness of 1,000 Å or less.

11. The method of claim 9, wherein the first insulating layer is made of HDP (High Density Plasma), and the second insulating layer is made of PE-TEOS (Plasma Enhanced-Tetra Ethyl Ortho Silicate).

12. A method of manufacturing a semiconductor device, the method comprising:
    sequentially forming a lower electrode, a dielectric layer, and a conductive layer on a semiconductor substrate;
    dry-etching a region of the conductive layer except a capacitor forming region without exposing the dielectric layer; and
    wet-etching the conductive layer to form an upper electrode exposing the dielectric layer to fabricate a capacitor.

13. The method of claim 12, wherein the conductive layer has a higher wet-etch rate than the dielectric layer.

14. The method of claim 12, further comprising performing one of plasma treatment and ion implantation of the conductive layer prior to the wet-etching.

15. The method of claim 14, wherein the plasma treatment is performed using $O_2$-containing plasma.

16. The method of claim 14, wherein the ion implantation is performed using one of He, Ne, Ar, Si, Ge, F, Cl, Br, In, and a combination thereof.

17. The method of claim 14, wherein the conductive layer has a higher wet-etch rate than the dielectric layer.

18. The method of claim 12, wherein an unetched region of the conductive layer except the capacitor forming region after the dry-etching has a thickness of 1,000 Å or less.

19. The method of claim 12, wherein in the sequentially forming of the lower electrode, the dielectric layer, and the conductive layer on the semiconductor substrate, the thickness of the conductive layer is substantially the same as or greater than the sum of the thickness of the upper electrode of the capacitor and the thickness of a region of the conductive layer removed by wet-etching.

20. The method of claim 12, wherein:
the conductive layer is a stacked structure composed of a first conductive layer and a second conductive layer;
dry-etching a region of the conductive layer except a capacitor forming region comprises dry-etching a region of the second conductive layer except the capacitor forming region;
wet-etching the conductive layer dry-etched comprises wet-etching a region of the first conductive layer except the capacitor forming region.

21. The method of claim 13, wherein the conductive layer comprises one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof.

22. The method of claim 13, wherein the conductive layer is one of a mono-layered structure and a multi-layered structure composed of one of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and a combination thereof.

23. The method of claim 13, wherein the wet-etching is performed using an etching solution selected from the group consisting of HF, $H_2SO_4$, and SC1.

24. The method of claim 14, wherein the conductive layer comprises one of Ru, Rh, Os, Pd, Pt, W, Mo, Ti, Ta, Al, Cu, Hf, Zr, WN, MoN, TiN, TaN, AlN, HfN, ZrN, TaSiN, and a combination thereof.

25. The method of claim 17, wherein the conductive layer is one of a mono-layered structure and a multi-layered structure composed of one of $HfO_2$, HfSiO, HfAlO, $ZrO_2$, ZrSiO, ZrAlO, $Ta_2O_5$, $TiO_2$, $Al_2O_3$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and a combination thereof.

26. The method of claim 17, wherein the wet-etching is performed using an etching solution selected from the group consisting of HF, $H_2SO_4$, and SC1.

27. The method of claim 20, wherein dry-etching of the region of the second conductive layer except the capacitor forming region is performed using an end point detection method until the first conductive layer is exposed.

28. The method of claim 20, wherein the first conductive layer has a thickness of 1,000 Å or less.

* * * * *